(12) United States Patent
Roy et al.

(10) Patent No.: US 11,949,417 B2
(45) Date of Patent: Apr. 2, 2024

(54) PRECISION OSCILLATORS THAT USE IMPRECISE COMPONENTS

(71) Applicant: TEXAS INSTRUMENTS INCORPORATED, Dallas, TX (US)

(72) Inventors: Aniruddha Roy, Bengaluru (IN); Nitin Agarwal, Bengaluru (IN); Rajavelu Thinakaran, Bengaluru (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 17/838,029

(22) Filed: Jun. 10, 2022

(65) Prior Publication Data

US 2022/0302906 A1  Sep. 22, 2022

Related U.S. Application Data

(63) Continuation of application No. 17/008,466, filed on Aug. 31, 2020, now Pat. No. 11,387,814, which is a continuation of application No. 15/853,015, filed on Dec. 22, 2017, now Pat. No. 10,763,832.

(51) Int. Cl.
*H03K 3/0231* (2006.01)
*G05F 1/567* (2006.01)
*G05F 3/24* (2006.01)
*G05F 3/26* (2006.01)
(Continued)

(52) U.S. Cl.
CPC .......... *H03K 3/0231* (2013.01); *G05F 1/567* (2013.01); *G05F 3/245* (2013.01); *G05F 3/262* (2013.01); *H03K 3/011* (2013.01); *H03K 4/502* (2013.01)

(58) Field of Classification Search
CPC ...... H03K 3/0231; H03K 4/502; H03K 4/501; H03K 3/011; G05F 1/567; G05F 3/16; G05F 3/20; G05F 3/242; G05F 3/245; G05F 3/262
See application file for complete search history.

(56) References Cited

U.S. PATENT DOCUMENTS

| 4,380,745 A | 4/1983 | Barlow et al. |
| 4,454,483 A | 6/1984 | Baylor |
| 5,760,623 A | 6/1998 | Hastings |

(Continued)

OTHER PUBLICATIONS

Vilas Boas, A. L., Jefferson BD Soldera, and Alfredo Olmos. "A 1.8 V supply multi-frequency digitally trimmable on-chip IC oscillator with low-voltage detection capability." Proceedings of the 17th symposium on Integrated circuits and system design. 2004. (Year: 2004).*

(Continued)

*Primary Examiner* — Ryan Johnson
(74) *Attorney, Agent, or Firm* — Mandy Barsilai Fernandez; Frank D. Cimino

(57) ABSTRACT

Trimming components within an oscillator comprising: a trim-capable current source, wherein the trim-capable current source comprises a trimmable resistor and a trimmable current component, a comparator comprising a first input terminal that couples to the trim-capable current source and the second input terminal that couples to a reference voltage source, a switch coupled to the first input terminal and the trim-capable current source, and a trim-capable capacitor coupled to the switch, wherein the switch is coupled between the trim-capable capacitor and the trim-capable current source.

18 Claims, 7 Drawing Sheets

(51) Int. Cl.
*H03K 3/011* (2006.01)
*H03K 4/502* (2006.01)

(56) References Cited

U.S. PATENT DOCUMENTS

| | | | |
|---|---|---|---|
| 6,020,792 | A | 2/2000 | Nolan et al. |
| 6,052,035 | A | 4/2000 | Nolan et al. |
| 6,356,161 | B1 | 3/2002 | Nolan et al. |
| 7,432,771 | B2 | 10/2008 | Chu |
| 7,504,902 | B2 * | 3/2009 | Piasecki ............... H03K 5/2481 |
| | | | 331/111 |
| 7,566,994 | B2 * | 7/2009 | Medi ....................... H02M 3/06 |
| | | | 361/278 |
| 7,843,279 | B2 | 11/2010 | Chou et al. |
| 8,508,307 | B2 | 8/2013 | Mitsuda et al. |
| 10,763,832 | B2 * | 9/2020 | Roy ..................... H03K 3/0231 |
| 2003/0016566 | A1 | 1/2003 | Yamaki et al. |
| 2009/0302954 | A1 * | 12/2009 | Chen ..................... H03K 3/011 |
| | | | 331/111 |
| 2018/0351538 | A1 * | 12/2018 | Tanaka ................... H03K 4/501 |
| 2019/0265280 | A1 | 8/2019 | Kimura |

OTHER PUBLICATIONS

Ghidini, Chiara, et al. "A digitally programmable on-chip RC-oscillator in 0.25/spl mu/m CMOS logic process." 2005 IEEE International Symposium on Circuits and Systems. IEEE, 2005. (Year: 2005).

* cited by examiner

PRECISION OSCILLATORS THAT USE IMPRECISE COMPONENTS

CROSS-REFERENCE TO RELATED APPLICATIONS

This application is a continuation of U.S. patent application Ser. No. 17/008,466 filed on Aug. 31, 2020 which is a continuation of U.S. patent application Ser. No. 15/853,015 filed on Dec. 22, 2017 (now patented as U.S. Pat. No. 10,763,832), which are incorporated herein by reference in their entirety.

BACKGROUND

Oscillators are electronic devices that produce periodic, output signals, such as sine waves, square waves, or triangle waves. To generate oscillating, output signals, oscillators often convert direct current (DC) received from a power source to an alternating current (AC) signal. By utilizing an oscillator's output signals, circuit designers are able to utilize oscillators for a variety of electronic systems ranging from clock generation in control logic components (e.g., microprocessors), transmitting signals for transmitter devices, producing audio sounds, and performing carder synthesis in cellular technology. Depending on the application, oscillators can exhibit different topologies and performance parameters. As an example, circuit designers may employ low frequency oscillators (e.g., about 20 hertz (Hz)) in audio synthesizing applications while radio frequency (RF) oscillators produce output signals that range in frequencies of about 100 kilohertz (kHz) to 100 gigahertz (GHz).

Circuit designers may prefer external oscillators instead of internal oscillators in certain applications requiring relatively high precision and stable output signals. Internal oscillators, which are also known as zero-pin oscillators, are generally less precise because of the devices' susceptibility to noise and/or temperature variation. The imprecision drawbacks for internal oscillators can originate from fabrication technology and process variations. For instance, a manufacturer may use polysilicon material to fabricate components, such as poly-resistor components, within the internal oscillator. Unfortunately, due to properties of the polysilicon material, polysilicon-based components can have a relatively high temperature coefficient (e.g., about a 2,500 parts per million (ppm) per degree Celsius (° C.) for a poly-resistor component) that affects the component's attributes as operation temperature changes. Although manufacturers may use other types of components with lower temperature coefficients, such as silicide poly-resistor component (e.g., about 100-200 ppm/° C.) or zero temperature coefficient of resistance (ZTCR) component (e.g., less than 50 ppm/° C.), the cost of fabricating internal oscillators with the more precise components generally tend to be more expensive. Thus, being able to improve the accuracy of internal oscillators without increasing fabrication costs remains valuable in fabricating precision oscillators.

SUMMARY

The following presents a simplified summary of the disclosed subject matter in order to provide a basic understanding of some aspects of the subject matter disclosed herein. This summary is not an exhaustive overview of the technology disclosed herein. It is not intended to identify key or critical elements of the invention or to delineate the scope of the invention. Its sole purpose is to present some concepts in a simplified form as a prelude to the more detailed description that is discussed later.

In one implementation, an oscillator including: a trim-capable current source, wherein the trim-capable current source includes a trimmable resistor and a trimmable current component; a comparator including a first input terminal that couples to the trim-capable current source and the second input terminal that couples to a reference voltage source, a switch coupled to the first input terminal and the trim-capable current source; and a trim-capable capacitor coupled to the switch, wherein the switch is coupled between the trim-capable capacitor and the trim-capable current source.

In another implementation, an oscillator including: a trim-capable current source configured to: trim one or more resistance values that affects a first portion current of a capacitor charging current generated from the trim-capable current source and trim the first portion current to adjust a proportion of the first portion current in the capacitor charging current generated from the trim-capable current source; a comparator including a first input terminal that couples to the trim-capable current source and a second input terminal that couples to a reference voltage source; and a trim-capable capacitor coupled to the first input terminal, wherein the trim-capable capacitor is configured to perform capacitor switching that controls a charge time of the trim-capable capacitor.

In yet another implementation, a method including: trimming, for a relaxation oscillator, one or more resistance values that affects a first portion current of a capacitor charging current generated from a trim-capable current source located within the relaxation oscillator, trimming, for the relaxation oscillator, the first portion current to adjust a proportion of the first portion current in the capacitor charging current generated from the trim-capable current source, wherein the capacitor charging current is a combination of the first portion current and a second portion current; and trimming, for the relaxation oscillator, a trim-capable capacitor to perform capacitor switching that controls a charge time of the trim-capable capacitor.

BRIEF DESCRIPTION OF THE DRAWINGS

For a detailed description of various examples, reference will now be made to the accompanying drawings in which.

Figure 1:
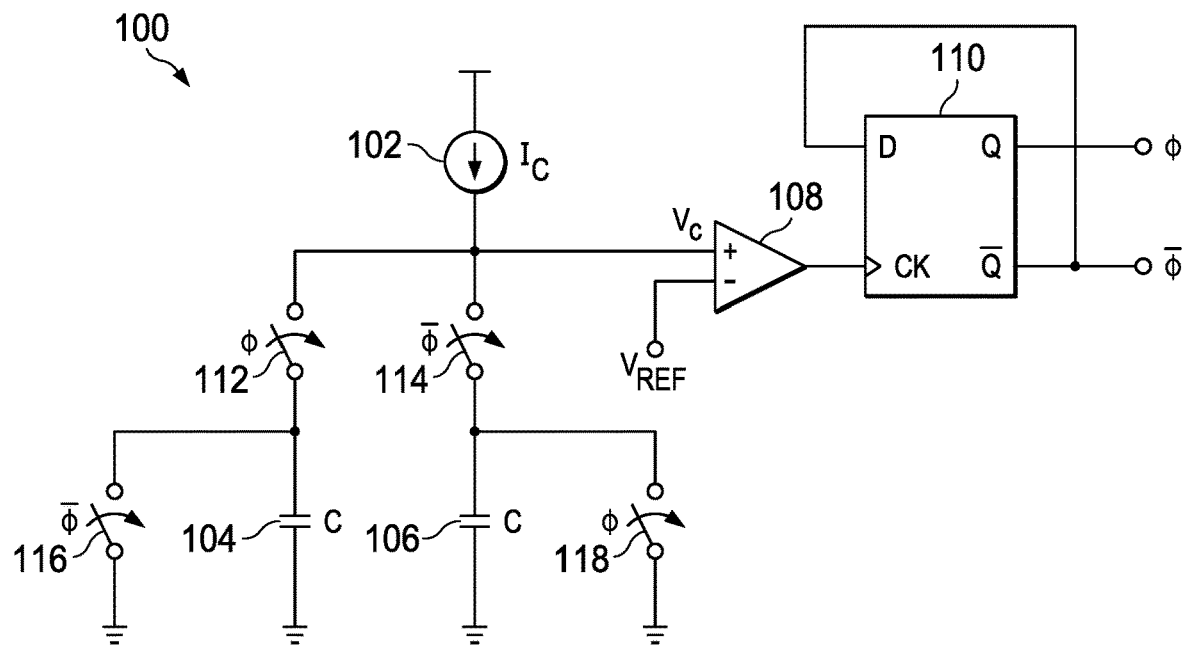
FIG. 1 is a block diagram of an oscillator in accordance with various implementations.

While certain implementations will be described in connection with the illustrative implementations shown herein, the invention is not limited to those implementations. On the contrary, all alternatives, modifications, and equivalents are included within the spirit and scope of the invention as defined by the claims. In the drawing figures, which are not to scale, the same reference numerals are used throughout the description and in the drawing figures for components and elements having the same structure, and primed reference numerals are used for components and elements having a similar function and construction to those components and elements having the same unprimed reference numerals.

DETAILED DESCRIPTION

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors. The terms "a," "an," and "the" are not intended to refer to a singular entity unless explicitly so defined, but include the general class of which a specific example may be used for illustration. The use of the terms "a" or "an" may therefore mean any number that is at least one, including "one," "one or more," "at least one," and "one or more than one." The term "or" means any of the alternatives and any combination of the alternatives, including all of the alternatives, unless the alternatives are explicitly indicated as mutually exclusive. The phrase "at least one of" when combined with a list of items, means a single item from the list or any combination of items in the list. The phrase does not require all of the listed items unless explicitly so defined.

The above discussion is meant to be illustrative of the principles and various implementations of the present invention. Numerous variations and modifications will become apparent to those skilled in the art once the above disclosure is fully appreciated. It is intended that the following claims be interpreted to embrace all such variations and modifications.

As used herein, the term "imprecise component" refers to a component with variance of more than ±50% around a nominal process corner, more than 500 ppm/° C. variation in a temperature coefficient, more than 1000 ppm/° C. nominal temperature coefficient, or any combination thereof. The imprecise components within an oscillator could allow an oscillator's accuracy to exceed ±1 percent across process, voltage and temperature (PVT). An example of an imprecise component is a poly-resistor component that could have a nominal temperature coefficient of about 2,500 ppm/° C. which may vary from 1500 to 3300 ppm/° C. over a fabrication process. Also used herein, the term "precise component" refers to a component with variance of less than ±20 percent around a nominal process corner, less than 200 ppm/° C. temperature coefficient, or both. The precise components within the oscillator could allow the oscillator's accuracy to be equal to or less than ±1 percent across PVT. Examples of precise components are a silicide poly-resistor component that could have a temperature coefficient of about 100-200 ppm/° C. or a zero temperature coefficient of resistance (ZTCR) component that could have a temperature coefficient of less than about 50 ppm/° C.

Various example implementations are disclosed herein to reduce operation variation for internal oscillators that do not contain precision components. In one or more implementations, the internal oscillators are relaxation oscillators that include one or more comparators and at least one current source that charge multiple capacitors. The comparators are situated to compare the capacitor voltages to one or more reference voltages in order to generate one or more periodic output signals. To manage the variability effects of including imprecise components, such as a poly-resistor component, the internal oscillator is able to perform trimming operations for at least some of the imprecise components. As an example, an internal oscillator may implement trimming operations with digital-to-analog circuits (DAC), such as resistor DACs (RDACs), current DACs (IDACs), and capacitor DACs (CDACs). The internal oscillator includes RDACs to trim and correct the resistance values of the poly-resistor components. To further improve accuracy, an IDAC performs a temperature slope trim to adjust a first portion current of the charging current supplied to the capacitors. Specifically, the temperature slope trim can be based on correcting the resistor ratios of the poly-resistor components. After completing the temperature slope trim, one or more CDACs may trim the charging capacitors to correct for any remaining variability or errors caused from process and/or temperature variances.

FIG. 1 is a block diagram of an oscillator 100 in accordance with various implementations. In FIG. 1, the oscillator 100 is a non-crystal based oscillator that includes a current source component 102, capacitor components 104 and 106, comparator 108, and a Data (D) flip flop 110. Capacitor components 104 and 106 are capable of being coupled to the non-inverting terminal of comparator 108 depending on whether switches 112 and 114 are in a closed or open position. To generate the input voltage signal Vc at the non-inverting terminal of comparator 108, the current source component 102 is also coupled to the non-inverting input terminal of comparator 108 and charges capacitor components 104 or 106 depending on the positions of switches 112 and 114. Capacitor components 104 and 106 are also connected to switches 116 and 118 to allow capacitor components 104 and 106 to discharge by connecting them to a ground reference. The comparator 108 contains an inverting input terminal that couples to a reference power circuit (not shown in FIG. 1) that supplies a reference voltage $V_{REF}$. The output of the comparator 108 is coupled to the clock (CK) input of the D flip flop 110 to generate oscillating output signals labeled as φ and $\bar{\phi}$ at the D flip flop's 110 output terminals. The output signal φ represents the positive voltage half cycle of the oscillator's 100 output signal, and output signal $\bar{\phi}$ represents the negative voltage half cycle of the oscillator's 100 output signal. The output signal $\bar{\phi}$ is connected to the D flip flop's 110 data input terminal to form a feedback loop.

As shown in FIG. 1, oscillator 100 is a relaxation oscillator that performs current capacitor charging to generate capacitor voltage Vc and compares the capacitor voltage Vc to a reference voltage $V_{REF}$. Switches 112, 114, 116, and 118 are in open or closed states depending on whether the oscillator 100 is generating a positive voltage half cycle (e.g., a high output signal φ) or a negative half cycle (e.g., a high output signal $\bar{\phi}$) as the oscillator's 100 output signal. When the oscillator 100 produces a positive voltage half cycle, switches 112 and 118 are in a closed position while the switches 114 and 116 are in an open position. During the positive voltage half cycle, the current source component 102 supplies current to capacitor component 104 via switch 112 to generate the capacitor voltage Vc. Capacitor voltage Vc continues to increase to a point where capacitor voltage Vc meets and/or exceeds the voltage $V_{REF}$. Closing switch 118 discharges any charge stored by capacitor component 106 by connecting the switch to the ground reference.

At the negative voltage half cycle, switches 114 and 116 are in the closed position while switches 112 and 118 are in an open position. The current source component 102 provides current to capacitor component 106 to generate the capacitor voltage Vc. Since capacitor component 106 was discharged during the positive voltage half cycle, the capacitor component 106 initially provides a relatively low capacitor voltage Vc (e.g., 0 volts). Capacitor voltage Vc increase as the current source component 102 charges capacitor component 106 via switch 114. Meanwhile, capacitor component 104 discharges any stored charge by closing switch 116 and connecting the capacitor component 104 to the ground reference.

Figure 2:
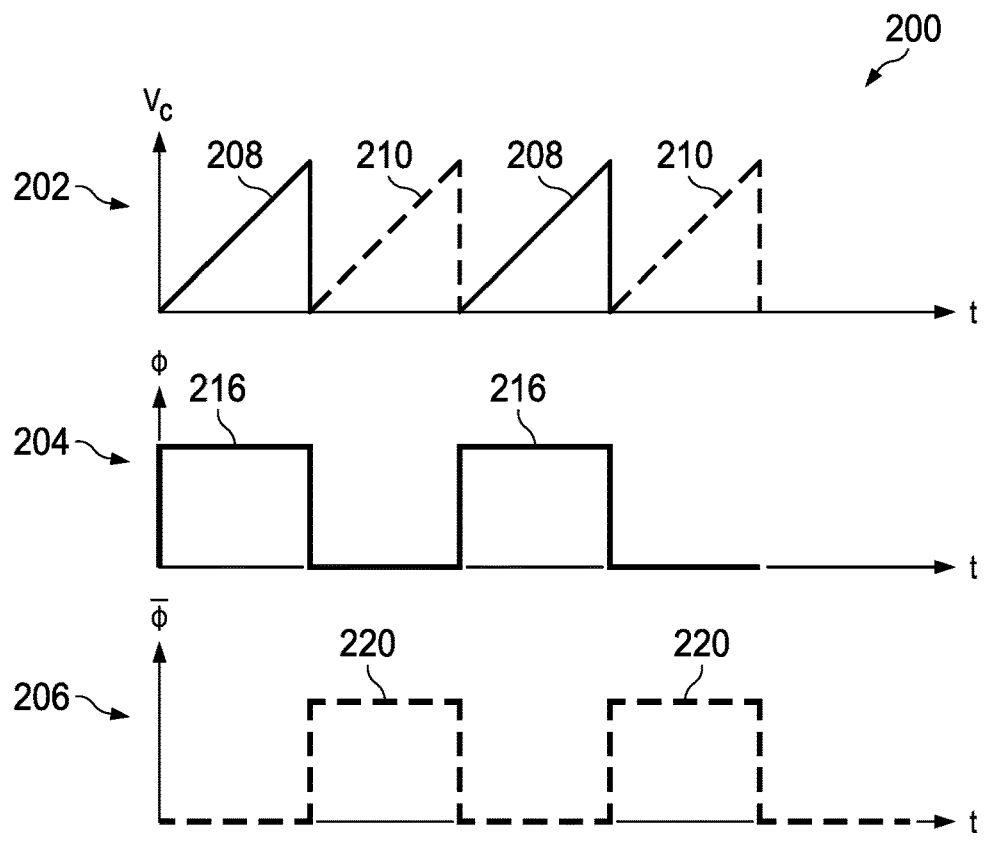
FIG. 2 illustrates a waveform diagram that provide waveform graphs that correspond to the operation of the oscillator shown in FIG. 1.

FIG. 2 illustrates a waveform diagram 200 that provide waveform graphs 202, 204, and 206 that correspond to the operation of oscillator 100 shown in FIG. 1. With reference to FIG. 1, waveform graph 202 plots the capacitor voltage Vc at the non-inverting terminal of comparator 108 for a period of time; waveform graph 204 plots the output signal φ associated with positive voltage half cycle generated at the D flip flop 110 for the same period of time; and waveform graph 206 plots the output signal $\bar{\phi}$ associated with the negative voltage half cycle generated at the D flip flop 110 for the same period of time. Each time the capacitor voltage Vc reaches a voltage that meets and/or exceeds the reference voltage $V_{REF}$, the comparator pulses causing the D flip flop 110 to change states.

As shown in waveform graph 202, the capacitor voltage Vc has a repeating pattern that is similar to a sawtooth waveform or an asymmetric triangle waveform. At sawtooth waves 208, switches 112 and 118 are in a closed position to generate the positive voltage half cycle wave 216. The voltage increase for Vc at sawtooth waves 208 represents the capacitor component 104 being charged by current source component 102. The slope of the sawtooth waves 208, which represents the charge rate of capacitor component 104, is dependent on the capacitor charging current Ic and capacitance of capacitor component 104. As discussed above with reference to FIG. 1, while the current source component 102 charges the capacitor component 104, capacitor component 106 is being discharged by closing switch 118 and opening switch 114.

For sawtooth waves 210, switches 114 and 116 are in a closed position to generate the negative voltage half cycle wave 220. The drop in voltage Vc shown in the sawtooth wave 210 corresponds to transitioning switches 114 and 116 to a closed position and switches 112 and 118 to an open position. Previously, capacitor component 106 was discharged to a relatively low voltage (e.g., about 0 volts) causing the voltage Vc to drop at the beginning of sawtooth wave 210. Once the switches 112, 114, 116, and 118 are in their updated position, the current source component 102 then charges capacitor component 106; thereby, increasing voltage Vc supplied to the comparator 108. Charging capacitor component 106 to increase voltage Vc produces the negative voltage half cycle wave 220. The slope of the sawtooth waves 210, which represents the charge rate of capacitor component 106, is dependent on the capacitor charging current Ic and capacitance of capacitor component 106. As shown in waveform graphs 202, 204, and 206, the sawtooth waves 208 and 210 continue to repeat in the same manner for the remaining time period to continue generating the output signals φ and $\bar{\phi}$.

Precision oscillators generally produce relatively high precision and stable output signals, such as having output signals set to a precise and stable frequency. Referring back to FIG. 1, oscillator's 100 frequency for output signals φ and $\bar{\phi}$ can vary depending on the temperature coefficient of the resistance value associated with the current source component 102. In particular, the oscillator's 100 output frequency is based on the current source component's 102 supplied capacitor charge current Ic, the capacitance value of capacitor components 104 and 106, and reference voltage $V_{REF}$ supplied at the inverting terminal of the comparator 108. Equation 1 presented below specifically defines oscillator's 100 frequency value as:

$$F_{out} = \frac{I_c}{2CV_{REF}} \quad (1)$$

In equation 1, $F_{out}$ represents the output frequency of the oscillator 100, which is associated with the output signals φ and $\bar{\phi}$; Ic represents the capacitor charging current supplied by the current source component 102; C represents the charging capacitance value that corresponds to one of the charging capacitor components 104 and 106; and $V_{REF}$ represents the reference voltage supplied at the inverting terminal of the comparator 108. The current source component 102 supplies the capacitor charge current Ic, which is determined from the reference voltage $V_{REF}$ and the resistance value of the current source component 102. Equation 2 presented below defines the capacitor charge current Ic as:

$$I_c = \frac{V_{REF}}{R} \quad (2)$$

In equation 2, Ic represents the capacitor charging current supplied by the current source component 102; $V_{REF}$ represents the reference voltage supplied at the inverting terminal of the comparator 108; and R represents the resistance value of the current source component 102. From equation 2, equation 1 can be rewritten as shown in equation 3.

$$F_{out} = \frac{1}{2RC} \quad (3)$$

As shown in equation 3, the oscillator's 100 output frequency is based on the resistance value of the current source component 102 and the capacitance value of the corresponding charging capacitor component 104 or 106. Because of this dependency, the temperature coefficient of the resistance of the current source component 102 can affect the oscillator's 100 temperature coefficient of the output frequency.

In one or more implementations, the current source component 102 may include one or more imprecise resistor components that cause the frequency or time period for oscillator 100 to have a relatively large variance. For example, the resistance value of current source component 102 can be based on poly-resistor components that could potentially cause about ±30 percent variance in resistance values depending on the operation temperature and temperature coefficient at the process corner the device is in and about −60 percent to about +90 percent variance around a nominal processor corner.

The oscillator 100 can also suffer from variances from other components, such as capacitor components 104 and 106 and comparator 108. As an example, capacitors 104 and/or 106 may have about a ±20 percent variance in capacitance and comparator 108 may have about a ±5 percent variance caused from comparator delay and other margins. Because of process variations from one or more imprecise components, the time period and frequency for oscillator 100 can overall vary from about −80 percent to about +200 percent. Stated another way, the oscillator 100 could have about a 13 times min-to-max variation in the output frequency.

Figure 5:
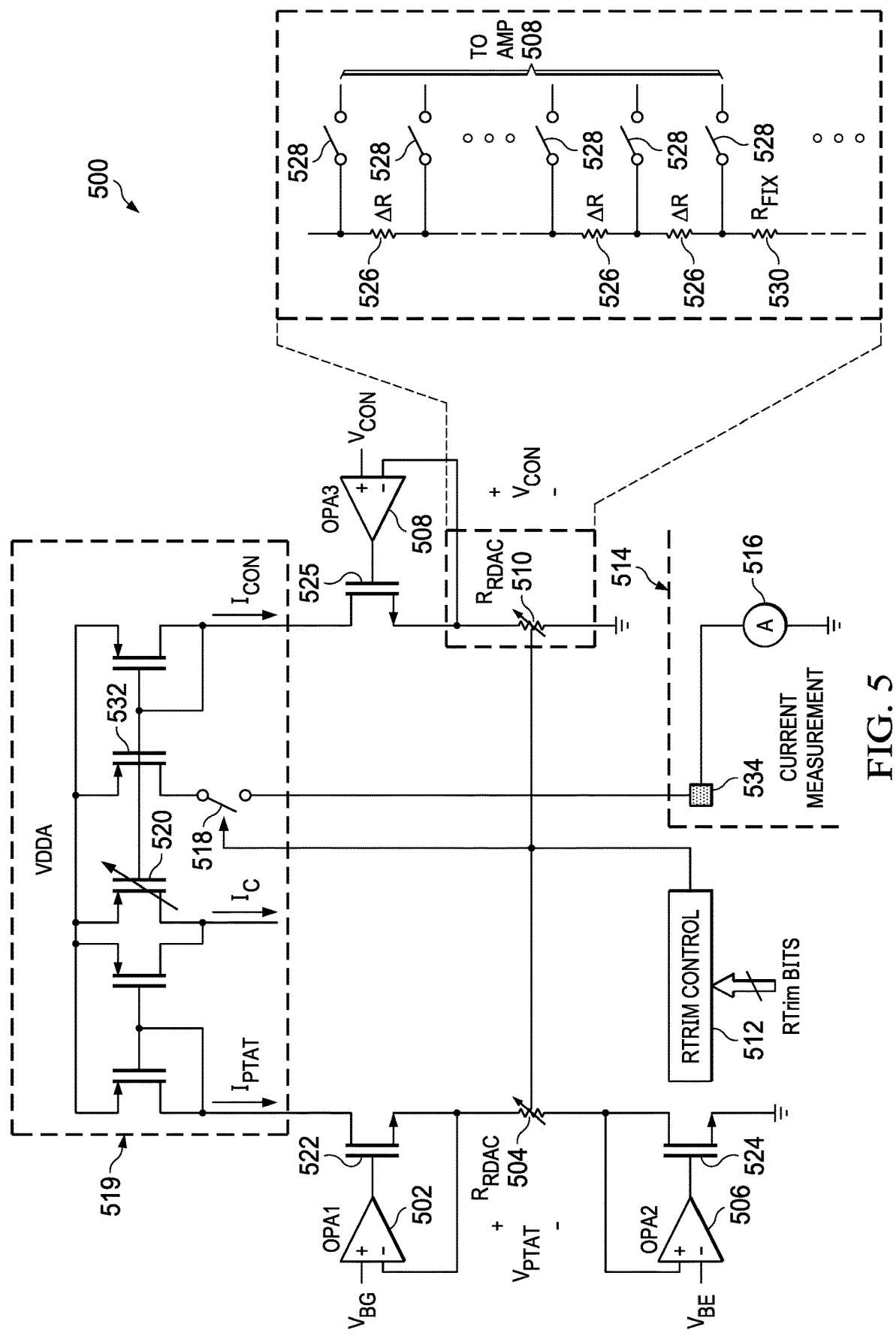
FIG. 5 is a schematic diagram of an implementation of a trim-capable current source component configured to perform a resistance value trim and temperature slope trim.
Figure 6:
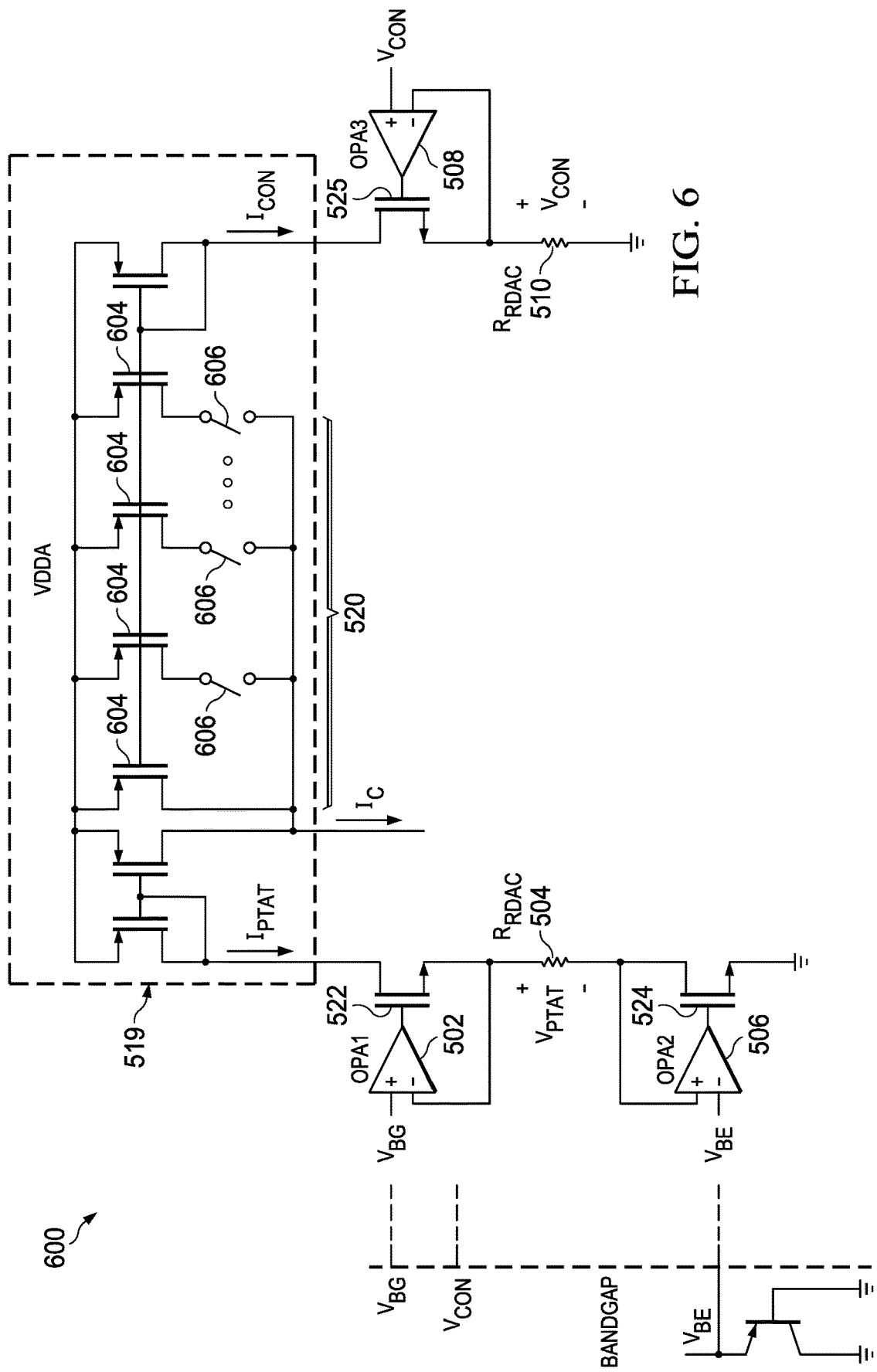
FIG. 6 is a schematic diagram of an implementation of a trim-capable current source configured to perform a temperature slope trim to further tune the capacitor charging current Ic.
Figure 7:
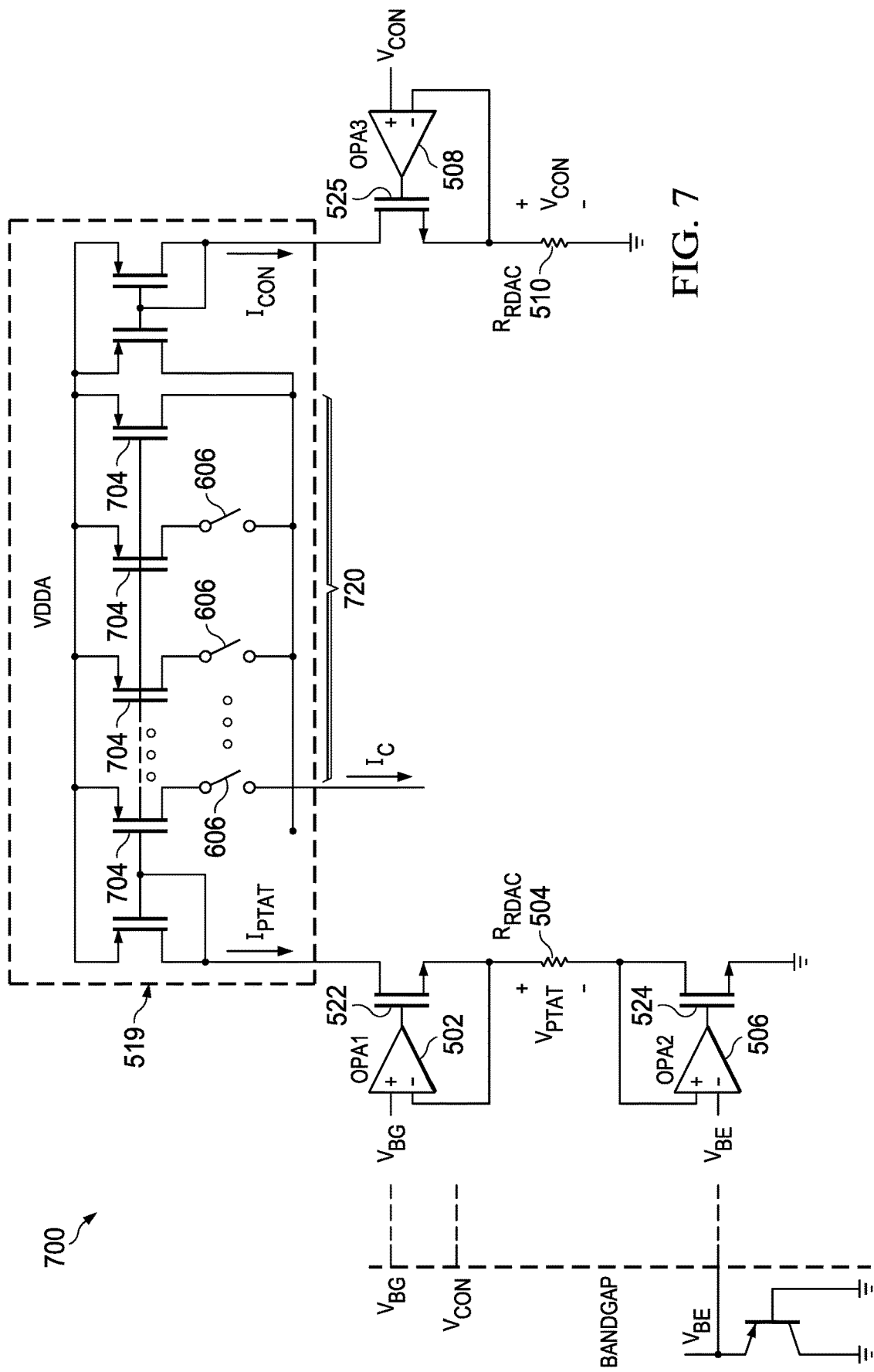
FIG. 7 is a schematic diagram of another implementation of trim-capable current source configured to perform a temperature slope trim to further tune the capacitor charging current Ic.

To reduce the impact of process and temperature variations associated with fabricating current source component 102, the current source component 102 and capacitor components 104 and 106 may be configured as trimmable components. In one or more implementations, the current source component 102 is able to perform a resistor trim that compensates for process variations for one or more imprecise resistor components (e.g., poly-resistor component). As an example, the current source component 102 may correct a first current portion of the capacitor charging current Ic defined as $V_{REF}/R$ by utilizing a trimmable resistor component, such as a RDAC. FIG. 5 provides more detail regarding the resistor trim. Additionally, the current source component 102 is able to perform a temperature slope trim to further tune the capacitor charging current Ic. The current source component 102 may utilize a trimmable current component, such as an IDAC, to implement a second current portion of the capacitor charging current defined as $V_{PTAT}/R$, which is generated from a PTAT (proportional to absolute temperature) voltage to generate a target capacitor charging current Ic. FIG. 6 provides more detail regarding the temperature slope trim. To further improve precision for oscillator 100 (e.g., precise and stable frequency), the capacitor components 104 and 106 may utilize capacitor trimmable components that performs a capacitor trim to tune the capacitance values. For example, each capacitor component 104 and 106 may include a CDAC to adjust the capacitance values to obtain a target frequency for oscillator 100. FIG. 7 provides more detail for the capacitor trim.

Figure 3:
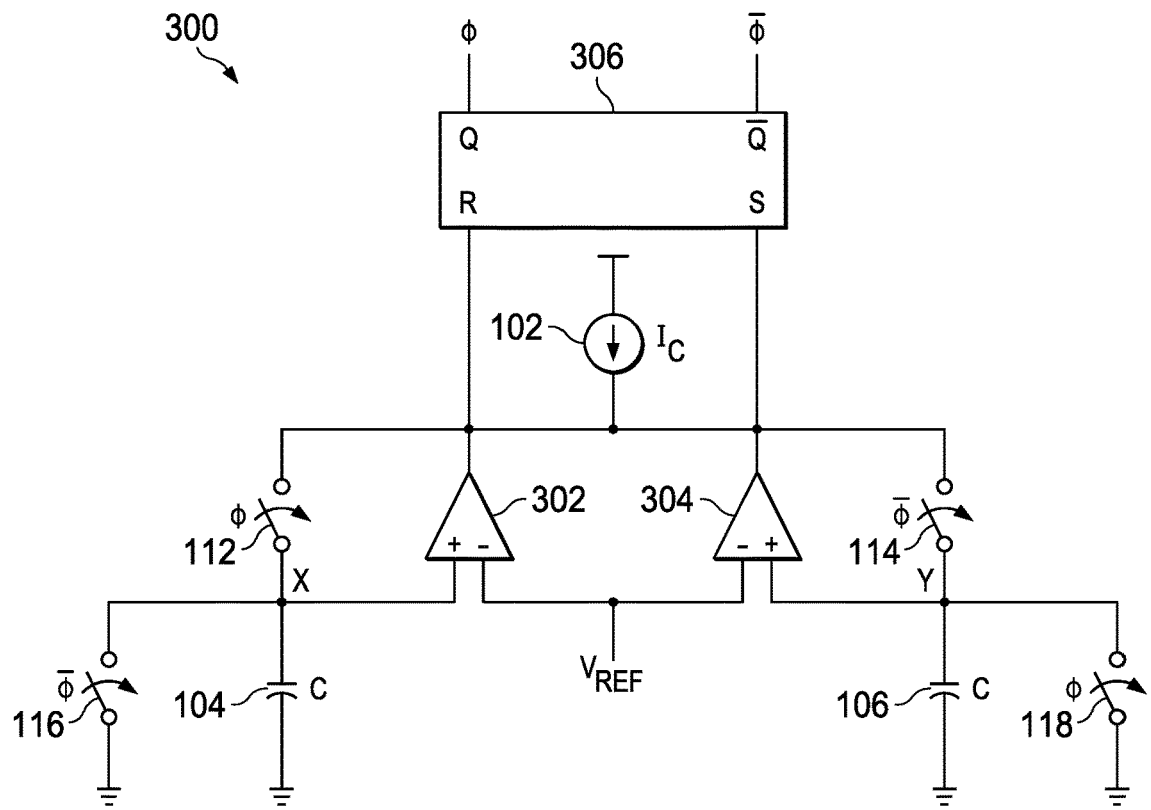
FIG. 3 is a schematic diagram of another oscillator in accordance with various implementations.

FIG. 3 is a schematic diagram of another oscillator 300 in accordance with various implementations. Similar to oscillator 100 shown in FIG. 1, oscillator 300 is a non-crystal-based, relaxation oscillator that includes a current source component 102 that provides charge current to capacitor components 104 and 106. Stated another way, oscillator 300 includes imprecise components that are susceptible to temperature and process variations. Oscillator 300 differs from oscillator 100 in that oscillator 300 contains two comparators 302 and 304 and a set-reset (SR) latch 306. As shown in FIG. 3, the inverting terminals of comparators 302 and 304 receive an input voltage of $V_{REF}$. The non-inverting terminals of comparators 302 and 304 are each connected to one of the capacitors 104 and 106 and the current source component 102 depending on whether switches 112 and 114 are open and closed. As an example, the non-inverting terminal of comparator 302 is connected to the current source component 102 and capacitor component 104 when switch 112 is in a closed position and switch 114 is in an open position. In another example, the non-inverting terminal of comparator 304 is connected to current source component 102 and capacitor component 106 when switch 114 is in a closed position and switch 112 is in an open position. The output of comparator 302 connects to the reset input terminal of the SR latch 306, and the output of comparator 304 connects to the set input terminal of the SR latch 306. Based on the received inputs, the SR latch 306 generates the output signals ϕ and $\overline{\phi}$.

Figure 4:
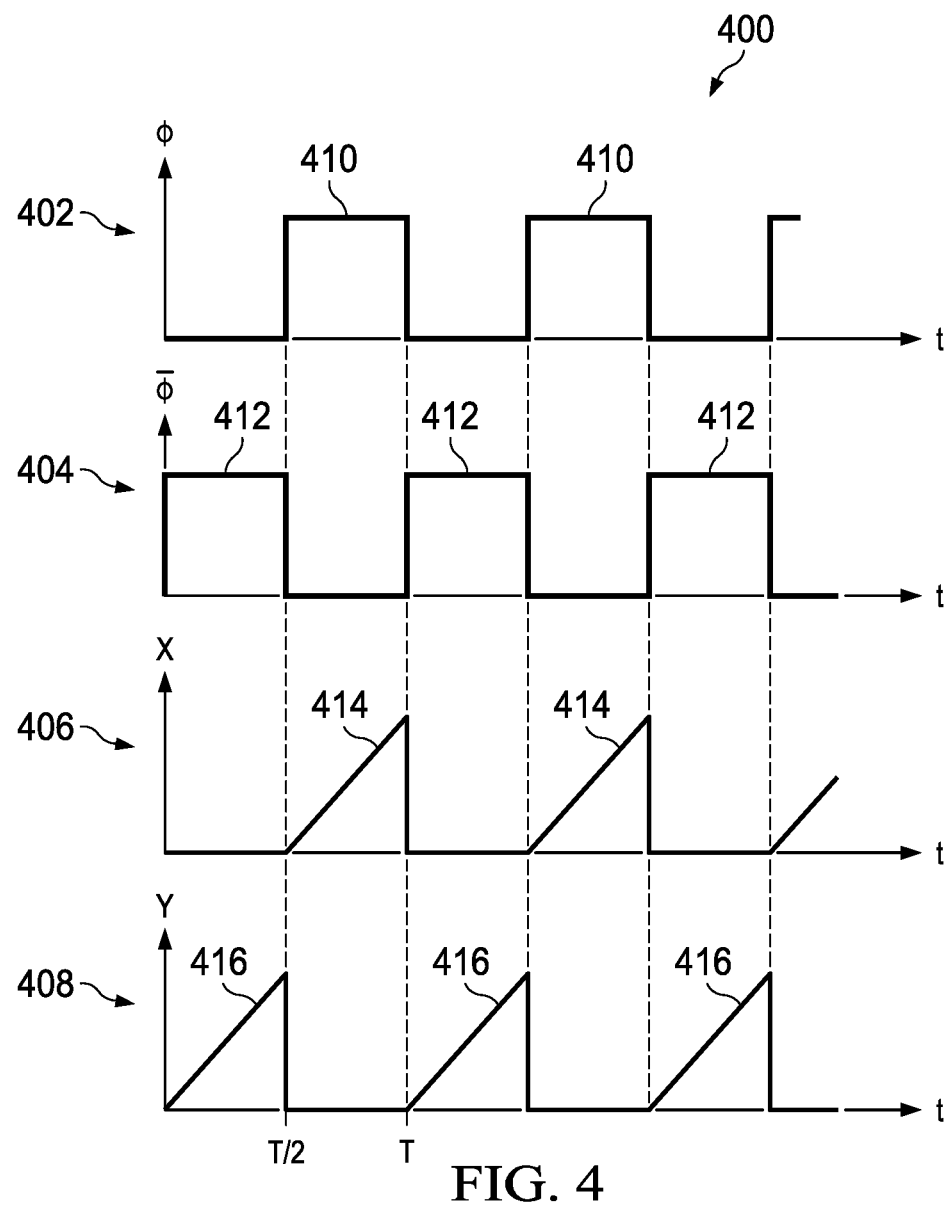
FIG. 4 illustrates a waveform diagram that includes waveform graphs that correspond to the operation of the oscillator shown in FIG. 3.

FIG. 4 illustrates a waveform diagram 400 that include waveform graphs 402, 404, and 406 that correspond to the operation of oscillator 300. Waveform graph 402 plots the output signal ϕ associated with a positive voltage half cycle generated at the SR latch's 306 Q output terminal over a period of time; waveform graph 404 plots the output signal $\overline{\phi}$ associated with the negative voltage half cycle generated at the SR latch's 306 $\overline{Q}$ output terminal; waveform graph 406 plots the capacitor voltage X (shown in FIG. 3) at the non-inverting terminal of comparator 302; and waveform 408 pertains to the capacitor voltage Y (shown in FIG. 3) at the non-inverting terminal of comparator 304.

As shown in waveform graphs 402 and 404, the capacitor voltage X starts with a relatively low voltage (e.g., 0 volts) and capacitor voltage Y produces a sawtooth wave 416. When the capacitor voltage Y meets and/or exceeds the reference voltage $V_{REF}$, comparator 304 pulses and causes the SR latch 306 to change states. Subsequently, capacitor voltage X transitions to a sawtooth wave 414 and capacitor voltage Y transitions to a relatively low voltage. Similar to capacitor voltage Y, when capacitor voltage X meets and/or exceeds the reference voltage $V_{REF}$, comparator 302 pulses and causes the SR latch 306 to change states. At the sawtooth wave 414, switches 112 and 118 are in a closed position and switches 114 and 116 are in an open position to generate the positive voltage half cycle wave. At the sawtooth waves 416, switches 112 and 118 are in an open position and switches 114 and 116 are in a closed position to generate the negative voltage half cycle wave.

Referring back to FIG. 3, to reduce the impact of process and temperature variations associated with fabricating current source component 102, oscillator 300 is able to perform trim operations at the current source component 102 and capacitor components 104 and 106. Rather than utilizing a single magnitude trim circuitry to trim the frequency of oscillator 300 within a ±1 percent accuracy, the oscillator 300 may implement a trim circuit that trims multiple components within the oscillator 300. The current source component 102 includes trimmable resistor components that can be trimmed to compensate for the process variation for one or more imprecise resistor components (e.g., poly-resistor component). Additionally, the current source component 102 includes a trimmable current component that performs a temperature slope trim to further tune the capacitor charging current Ic by compensating for temperature coefficient variation. To improve precision and stability of oscillator 300, the capacitor components 104 and 106 may also include trimmable capacitor components that tune the capacitance values. The different trim operations are referenced and discussed in more detail in FIGS. 5-7.

Although FIGS. 1 and 3 illustrate specific implementations of oscillators 100 and 300, the disclosed trimming operations are not limited to the specific implementation illustrated in FIGS. 1 and 3. For instance, switches 112, 114, 116, and 18 within FIGS. 1 and 3 may be implemented using a variety of different types of electrical switches, such as field-effect transistors (FETs). Examples of FETs include, but are not limited to enhanced n-channel metal-oxide semiconductor field-effect (NMOS) transistors, other types of NMOS transistors, a n-type junction gate field-effect transistor (NJFET), and a bipolar junction transistor (BJT) (e.g., NPN transistors). Additionally, rather than utilizing a D flip flop or a SR latch, a relaxation oscillator may employ another flip flop type component, latch type component, or some other type of electrical circuit configured to store state information and generate multiple stable states. The use and discussion of FIGS. 1 and 3 are only an example to facilitate ease of description and explanation.

FIG. 5 is a schematic diagram of an implementation of a trim-capable current source component 500 configured to perform a resistance value trim and temperature slope trim. As previously discussed, the trim-capable current source component 500 may be fabricated with fabrication and/or process technology that create imprecise components that have relatively large temperature coefficients, which in turn varies the capacitor charging current Ic based on temperature. To compensate for the relatively large process variations and temperature coefficients, the trim-capable current source component 500 is able to perform a resistance value trim using the RDAC components 504 and 510 and a temperature slope trim using a trimmable current component 520 that is part of the bias circuit 519. Temperature slope trimming with a trimmable current component 520, such as an IDAC component that compensates for temperature coefficient variation will be discussed in more detail in FIG. 6. The RDAC components 504 and 510 may be trimmed together to obtain a target resistance value to account for process variations.

In FIG. 5, the RDAC component 504 has one end that connects to an inverting terminal of amplifier 502 and an opposite end that connects to the non-inverting terminal of amplifier 506. The end of the RDAC component 504 that connects to an inverting terminal of amplifier 502 also connects to the source node of transistor 522. The RDAC component 510 has one end that connects to both the inverting terminal of amplifier 508 and the source node of transistor 525. The opposite end of RDAC component 510 connects to a ground reference. A constant voltage $V_{CON}$ represents the voltage supplied to the inverting terminal of amplifier 508 and also the voltage drop across RDAC component 510.

In one or more implementations, the RDAC components 504 and 510 are imprecise components (e.g., poly-resistor components) that have relatively large process variation. The RDAC components 504 and 510 are configured to adjust their resistance values in order to offset the relatively large process variation associated with each component. In one or more implementations, the RDAC components 504 and 510 may be poly-resistor components that have a process variation that ranges from −60% to +90%. As shown in FIG. 5, since a first current portion $I_{CON}$ of the charging current Ic is equal to $V_{CON}/R_{RDAC}$, any resistance variance in the RDAC component 510 affects the generated first current portion $I_{CON}$. To compensate for varying resistance values caused from process variation, the RDAC component 510 corrects the first current portion $I_{CON}$ by trimming to a resistance value $R_{RDAC}$. The trim-capable current source component 500 may trim the RDAC components 504 and 510 at a designated temperature (e.g., room temperature) to a resistance value $R_{RDAC}$ that is within a desired accuracy range (e.g., within 5-6% accuracy) of a target resistance value. As an example, because of process variation, the RDAC component 510 may have a resistance value at room temperature of 1.20 kilo-ohm when the target resistance value is set to 1.00 kilo-ohm. The RDAC component 510 performs a resistor trim to lower the actual resistance value $R_{RDAC}$ to less than or equal to 1.05 kilo-ohm. FIG. 5 also illustrates that the RDAC component 504 performs a similar resistor trim to have a resistance value that matches the resistance value $R_{RDAC}$.

To determine whether the resistance values for RDAC components 504 and 510 have drifted away from the target resistance value $R_{RDAC}$, the trim-capable current source component 500 includes a trim system 514 and a resistor trim control 512. The trim system 514 includes a current measurement component 516 (e.g., ammeter) that measures the first current portion $I_{CON}$ at a designated temperature (e.g., room temperature). To measure the first current portion $I_{CON}$, the resistor trim control 512 sets switch 518 to a close state to allow current to flow to the current measurement component 516. When switch 518 is in the close state, transistor 532 mirrors the first portion current $I_{CON}$ to the test pin 534 of the trim system 514 for measuring. Based on the measured current, which mirrors the first portion current $I_{CON}$, the trim system 514 determines the offset between the measured resistance value for RDAC component 510 and the target resistance value. The trim system 514 then translates the resistance offset into resistor trim bits to supply to the resistor trim control 512. The resistor trim control 512 utilizes the resistor trim bits to adjust the resistance value for the RDAC component 510 to be closer the target resistance value. The resistor trim control 512 also adjusts the resistance value of the RDAC component 504 to the target resistance value based on the measured current.

In one or more implementations, to adjust the resistance values, each of the RDAC components 504 and 510 may include multiple switches 528 that set which resistors 526 are connected in series to a fixed resistor 530. In FIG. 5, each of the resistors 526 are set to have the same resistance value of ΔR that increases the resistance from a fixed resistance value $R_{FIX}$. In other implementations, each resistor 526 can be set to different resistance values, such as ΔR, Δ2R, and/or Δ4R, to increase the resistance of the RDAC components 504 and 510. Based on the resistor trim bits, the resistor trim control 512 sets switches 528 to open or close positions. For instance, resistor trim control 512 may receive resistor trim bits indicating that only the fixed resistor 530 with resistance of value of $R_{FIX}$ should be connected to the inverting terminal of amplifier 508. In another instance, the resistor trim control 512 may receive resistor trim bits indicating that two of the resistors 526 should be connected in series to the fixed resistor 530 to be closer to the target resistance value.

FIG. 6 is a schematic diagram of an implementation of trim-capable current source 600 configured to perform a temperature slope trim to compensate for temperature variation relating to generating the capacitor charging current Ic. As previously referenced in equation 1, the frequency of an oscillator depends on the capacitor charging current Ic. Increasing the capacitor charging current Ic increases the frequency of the oscillator. In particular, with reference to FIG. 2, increasing the capacitor charging current Ic increases the slope of the sawtooth waves 208 and 210, which allows the capacitor voltage Vc to equal and/or exceed the reference voltage $V_{REF}$ in a shorter time frame. Conversely, decreasing the capacitor charging current Ic decreases the frequency of the oscillator, which decreases the slope of the sawtooth waves 208 and 210. Once the trim-capable current source 600 trims the RDAC components 504 and 510 to compensate for the components' process variation, the trim-capable current source 600 obtains a correct ratio of $V_{CON}$ and $V_{PTAT}$ to reduce temperature variation and produce a target capacitor charging current Ic.

The capacitor charging current Ic is derived from a combination of a proportioned current $I_{CON}$ and current $I_{PTAT}$. Equation 4 presented below defines the capacitor charging current Ic.

$$I_c = \frac{\beta V_{CON} + V_{PTAT}}{R_{RDAC}} \quad (4)$$

In equation 4, β represents a slope trim coefficient; Ic represents the capacitor charging current supplied by the current source component 102; $V_{CON}$ represents the voltage received at amplifier 508 and the voltage drop across RDAC component 510; $V_{PTAT}$ represents the voltage drop across RDAC component 504; and $R_{RDAC}$ represents the trimmed resistance value for RDAC components 504 and 510. With regards to β within equation 4, as the slope trim code changes, β will also change in order to manipulate the overall slope of frequency. Based on equation 4, the capacitor charging current Ic is the sum of the current $I_{PTAT}$ and the proportioned current $I_{CON}$.

From equation 4, equation 1 can be rewritten as shown in equations 5 and 6 to determine the frequency of the oscillator.

$$F_{out} = \frac{\beta V_{CON} + V_{PTAT}}{V_{REF}} * \left(\frac{1}{2R_{RDAC}C}\right) \quad (5)$$

$$= \left(\frac{\beta V_{CON}}{V_{REF}}\right) * \left(1 + \frac{V_{PTAT}}{\beta V_{CON}}\right) * \left(\frac{1}{2R_{RDAC}C}\right) \quad (6)$$

In equations 5 and 6, $F_{out}$ represents the output frequency of the oscillator; Ic represents the capacitor charging current supplied by the current source component 102; $V_{CON}$ represents the constant voltage received at amplifier 508 and the voltage drop across RDAC component 510; $V_{PTAT}$ represents the voltage drop across RDAC component 504; $R_{RDAC}$ represents the trimmed resistance value for RDAC components 504 and 510; $V_{REF}$ represents the reference voltage supplied to the comparators; and C represents the capacitance value of the corresponding charging capacitor components (e.g., one of the capacitor components 104 and 106 in FIGS. 1 and 3). Based on equation 6, the ratio of $V_{CON}$ and $V_{PTAT}$ affects the output frequency of the oscillator.

The PTAT current may be readily available from bandgap and/or can be derived from PTAT voltages from bandgap. In FIG. 6, a single bandgap circuit is used to generate the constant voltage $V_{CON}$ and the two voltage $V_{BG}$ and $V_{BE}$. Recall that the constant voltage $V_{CON}$ is supplied to the non-inverting terminal of amplifier 508. Voltage $V_{BG}$ is supplied to the non-inverting terminal of amplifier 502, and voltage $V_{BE}$ is supplied to the inverting terminal of amplifier 506. Voltages $V_{CON}$ and $V_{BG}$ have a constant voltage while voltage $V_{BE}$ has negative slope with temperature. Voltage $V_{PTAT}$ is equal to the difference in voltage $V_{BG}$ and $V_{BE}$. The accuracy of the bandgap voltage depends on the resistor ratio instead of absolute resistance values, and hence the resistors used in bandgap design can be imprecise components (e.g. the same type of resistor used in $R_{RDAC}$ components 504 and 510) rather than requiring a precision circuit with precision resistors. As shown in FIG. 6, a complementary to absolute temperature that reduces proportionally with temperature (CTAT) circuit is not used to generate the target capacitor charging current Ic.

Trim-capable current source 600 utilizes trimmable current component 520 to perform temperature slope trim that reduces the temperature coefficient of frequency for an oscillator. As an example, trimmable current component 520 may be an IDAC that corrects the ratio of voltage $V_{CON}$ and voltage $V_{PTAT}$ to obtain a target capacitor charging current Ic that contributes in achieving a precise and stable oscillator frequency. In FIG. 6, the trimmable current component 520 is configured to modify the current $I_{CON}$ through digital control. In implementations where the trimmable current codes is for an IDAC, the trim-capable current source 600 may adjust the trimmable current codes (e.g., IDAC codes) to tune the IDAC in order to increase or decrease the proportion current $I_{CON}$. Increasing the proportion of current $I_{CON}$ reduces the overall temperature slope of the oscillator's frequency. Conversely, decreasing the proportion of current $I_{CON}$ would increase the overall temperature slope of the oscillator's frequency. As shown in FIG. 6, to increase or decrease the proportion of current $I_{CON}$, trimmable current component 520 acts as current mirrors that enable one or more of the transistors 604 to obtain the desired first portion current $I_{CON}$. Switches 606 are used to enable the transistors 604 within trimmable current component 520 by setting the switches to an open state or a close state based on the trimmable current codes.

FIG. 7 illustrates a trim-capable current source 700 utilizes trimmable current component 720 to perform temperature slope trim that reduces the temperature coefficient of frequency for an oscillator. Similar to FIG. 6, trimmable current component 720 may be an IDAC that corrects the ratio of voltage $V_{CON}$ and voltage $V_{PTAT}$ to obtain a target capacitor charging current Ic that contributes in achieving a precise and stable oscillator frequency. In contrast to FIG. 6, the trimmable current component 720 is configured to modify the current $I_{PTAT}$ through digital control. In implementations where the trimmable current codes is an IDAC, the trim-capable current source 700 may adjust the trimmable current codes (e.g., IDAC codes) to tune the IDAC in order to increase or decrease the proportion current $I_{PTAT}$. Increasing the proportion of current $I_{PTAT}$ increases the overall temperature slope of the oscillator's frequency. Conversely, decreasing the proportion of current $I_{PTAT}$ would decrease the overall temperature slope of the oscillator's frequency. As show in FIG. 7, to increase or decrease the proportion of current $I_{PTAT}$, trimmable current component 720 acts as current mirrors that enable one or more of the transistors 704 to obtain the desired second portion current $I_{PTAT}$. Switches 606 are used to enable the transistors 704 within trimmable current component 720 by setting the switches to an open state or a close state based on the trimmable current codes.

Figure 8:
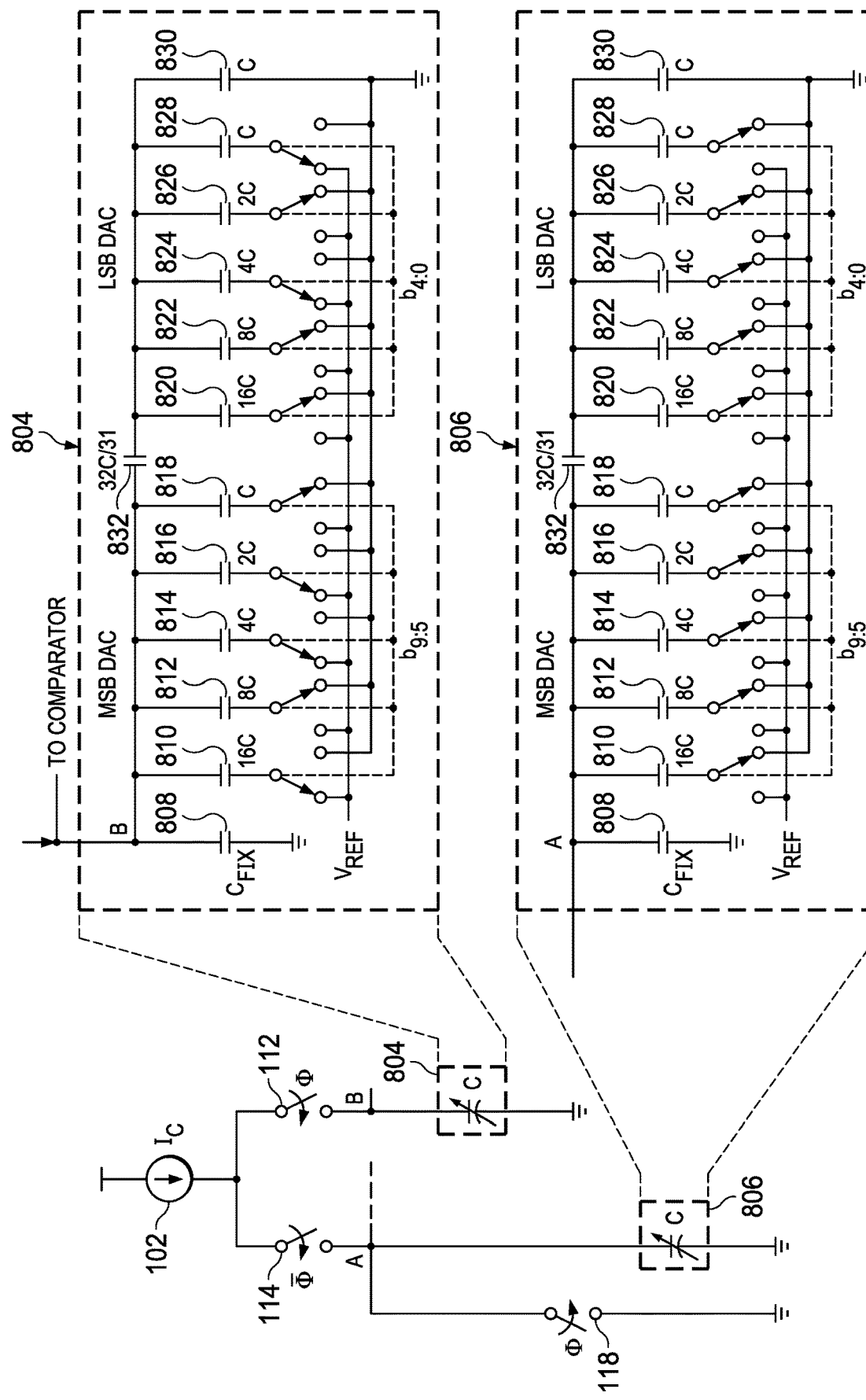
FIG. 8 is a schematic diagram of an embodiment of trimmable capacitor components.

FIG. 8 is a schematic diagram of an embodiment of trimmable capacitor components 804 and 806. Using FIG. 1 as an example, the trimmable capacitor components 804 and 806 correspond to or are part of the capacitor components 104 and 106, respectively. After performing the temperature slope trim, remaining magnitude error for achieving a target output frequency for an oscillator may be corrected with the trimmable capacitor components 804 and 806. Recall that in FIG. 6, the trim-capable current source 600 performs a temperature slope trim. When implementing a temperature slope trim to correct the temperature slope of the oscillator's frequency, the increase in the first proportion current $I_{CON}$ tends to increase the frequency magnitude of the oscillator and decreasing the first proportion current $I_{CON}$ tends to decrease the frequency magnitude. The increase and decreasing of the frequency magnitude could cause a residual magnitude error of frequency that may be corrected using the trimmable capacitor components 804 and 806.

In one or more implementations, each trimmable capacitor components 804 and 806 is a CDAC that trims the charging capacitor. Using FIG. 8 as an example, the trimmable capacitor components 804 and 806 include two 10 bit split-CDAC arrays, where two 10 bit split-CDAC arrays are identical to each other and utilize the same 10 bit trim code to regulate the capacitance charging time. Both trimmable capacitor components 804 and 806 are configured to include a capacitor 808 with a fixed capacitance $C_{fix}$ that connects in parallel with capacitor 830 that has a capacitance of C. Capacitor 832 is connected to capacitors 808 and 830 in series and has a capacitance of 32 C/31. The two 10 bit split-CDAC arrays include capacitors 810, 812, 814, 816, 818, 820, 822, 824, 826, and 828 that have capacitance 16 C, 8 C, 4 C, 2 C, C, 16 C, 8 C, 4 C, 2 C, and C, respectively. Other embodiments of the 10 bit split-CDAC array may be configured to assign different capacitance values for capacitors 810, 812, 814, 816, 818, 820, 822, 824, 826, and 828.

FIG. 8 illustrates that the trimmable capacitor components 804 and 806 utilize a 10 bit trim code with bits $b_{9:0}$ to perform capacitor switching of capacitors 810, 812, 814, 816, 818, 820, 822, 824, 826, and 828. As shown in FIG. 8, capacitors 810, 812, 814, and 816 are part of the CDAC array that corresponds to the most significant bits of the 10 bit trim code and capacitors 818, 820, 822, 824, and 826 are part of the CDAC array that correspond to the least significant bits of the 10 bit trim code. Specifically, capacitors 810, 812, 814, and 816 represents trim bits $b_{9:5}$ and capacitors 818, 820, 822, 824, and 826 represents trim bits $b_{4:0}$ of the 10 bit trim code. The bottom plates of capacitors 810, 812, 814, 816, 818, 820, 822, 824, 826, and 828 may switch from ground to reference voltage $V_{REF}$ depending on whether their corresponding trim bits $b_{9:0}$ are set to a designated logical value (e.g., logic value one). As an example, if bit $b_9$ of the 10 bit trim code is set to a logic value of one, the bottom plate of capacitor 810 is connected to the reference voltage $V_{REF}$. Alternatively, if bit $b_9$ of the 10 bit trim code is set to a logic value of zero, the bottom plate of capacitor 810 is connected to a ground reference.

In one half cycle (e.g., the positive voltage half cycle), capacitors 810, 812, 814, 816, 818, 820, 822, 824, 826, and 828 for one of the CDAC arrays will be grounded and discharged, while in the other CDAC array, the bottom plates of capacitors 810, 812, 814, 816, 818, 820, 822, 824, 826, and 828 switch from ground (e.g., 0 volts) to reference voltage $V_{REF}$. In the next half cycle (e.g., the negative voltage half cycle) the roles for the CDAC arrays will be reversed. By having the bottom plates of capacitors 810, 812, 814, 816, 818, 820, 822, 824, 826, and 828 switch from ground (e.g., 0 volts) to reference voltage $V_{REF}$, nodes A and B in FIG. 8 are pre-charged to fraction of $V_{REF}$. Pre-charging to a fraction of $V_{REF}$ in turn controls charging time for the trimmable capacitor components 804 and 806, the time period of the oscillator, and the frequency of the oscillator. Equation 7 presented below defines the capacitor charging current Ic based on a 10 bit trim code.

$$T = \frac{2V_{REF}}{I_C} * \left[ C_{fix} + 32C\left(1 - \frac{1\sum_0^9 b_m 2^m}{1024}\right) \right] \quad (7)$$

In equation 7, T represents the time period for the oscillator; Ic represents the capacitor charging current supplied by the current source component; $V_{REF}$ represents the reference voltage supplied to the comparators; $C_{fix}$ represents the capacitance value of capacitor 808 within the CDAC; C represents the capacitance value of capacitors 818 and 828; and $b_m$ represents the trim bit of the 10 bit trim code. Equation 7 can be modified accordingly based on the number of trim bits.

Although FIG. 8 illustrates utilizing a CDAC array for a 10 bit trim code, other embodiments could use other trim code lengths depending on the trim range. As an example, rather using one or more 10 bit split-CDAC array, the oscillator may include one or more 8 bit CDAC arrays that provide for lower trimming resolution. Within the 8 bit CDAC array, bits $b_{7:0}$ may be associated with varying capacitance values. In one implementation, bit $b_0$ to $b_7$ could have capacitance values of C, 2 C, 4 C, 8 C, 16 C, 32 C, 64 C, and 128 C, respectively. An oscillator may use the 8 bit CDAC rather than a 10 bit split-CDAC array depending on the process technology of the trimmable capacitor components 804 and 806 and/or the amount of comparator delay.

Figure 9:
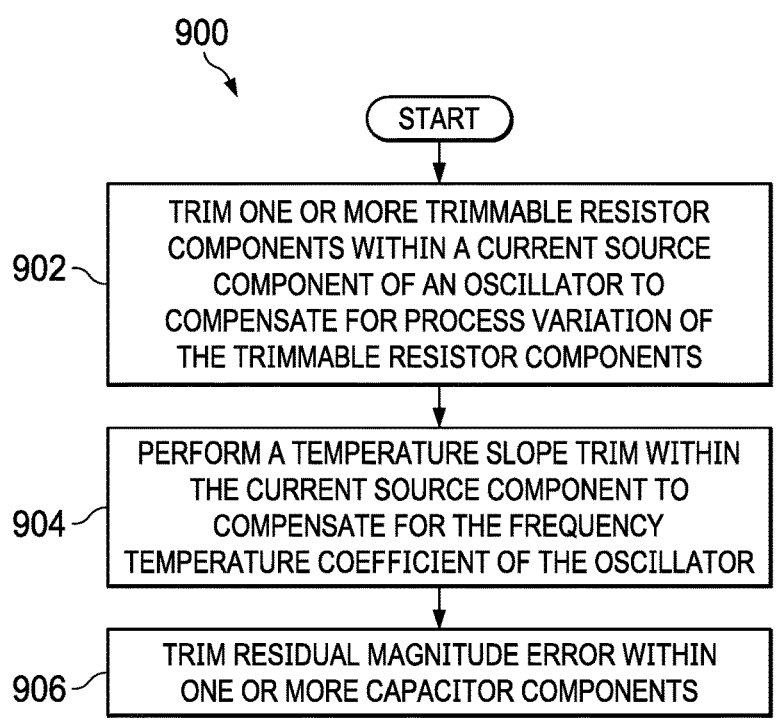
FIG. 9 is a flow chart of an implementation of a method to trim multiple components within a precision oscillator to stabilize and reach a target frequency.

FIG. 9 is a flow chart of an implementation of a method 900 to trim multiple components within a precision oscillator to stabilize and reach a target frequency. Using FIGS. 1 and 3 as examples, method 900 can be implemented for the oscillators 100 and 300. Method 900 may also be application to other types of relaxation oscillators that utilize a current source to charge capacitors and compares the capacitor voltages to a reference voltage. Method 900 starts at block 902 to trim one or more trimmable resistor components with a current source component to compensate for process variations of the trimmable resistor components. With reference to FIG. 5, method 900 performs a trim to compensate for varying resistance values originating from process variations using RDAC components 504 and 510. Method 900 may determine whether the resistance values for RDAC components 504 and 510 are outside a target range (e.g., within 5-6% of the target resistance value). If so, method 900 translates the resistance offset into resistor trim bits to adjust the resistance value for RDAC components 504 and 510 to be closer the target resistance value.

Method 900 may then move to block 904 and perform a temperature slope trim within the current source component to compensate for the frequency temperature coefficient of the oscillator. Recall in FIG. 6, that capacitor charging current Ic affects the frequency of the oscillator. Method 900 performs the temperature slope trim to obtain a correct ratio between the first current portion $I_{CON}$ and second current portion $I_{PTAT}$. In other words, method 900 may increase or decrease the proportion of constant current $I_{CON}$ to reach target frequency output for the oscillator. Method 900 may then continue to block 906 and trim residual magnitude error within one or more capacitor components. As discussed above with reference to FIG. 9, method 900 may implement block 906 using a CDAC that trims the charging capacitor. In one or more implementations, method 900 may trim the capacitance according to a 10 bit trim code that switch the bottom plates of capacitors within the CDAC array from ground (e.g., 0 volts) to reference voltage $V_{REF}$. Other embodiments may utilize other trim code resolution, such as a 9 bit trim code.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations may be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). The use of the term "about" means±10% of the subsequent number, unless otherwise stated.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise.

What is claimed is:

1. An oscillator comprising:
  a trimmable capacitor;
  a trimmable current source coupled to the trimmable capacitor, wherein the trimmable current source includes:
    a first trimmable resistor and a second trimmable resistor, and wherein the first trimmable resistor and the second trimmable resistor each include: a fixed resistor; a plurality of resistors; and a first plurality of switches, each of the first plurality of switches is coupled to a respective one of the plurality of resistors; and
    a bias circuit coupled to a trim control, wherein the bias circuit includes a first portion current coupled to the first trimmable resistor and a second portion current coupled to the second trimmable resistor;
  a comparator coupled to the trimmable current source, the comparator including a comparator output; and
  a data storage element coupled to the comparator output, the data storage element including one of a flip-flop and a latch;
  wherein the bias circuit includes:
    a plurality of transistors coupled in parallel and a second plurality of switches, and wherein each of the second plurality of switches is coupled to a respective drain of the plurality of transistors.

2. The oscillator of claim 1, wherein:
  the comparator includes a negative input; and
  the negative input is coupled to a voltage reference.

3. The oscillator of claim 1, wherein:
  the trimmable capacitor includes:
    a first capacitor;
    a first plurality of capacitors coupled in parallel, the first plurality of capacitors coupled to the first capacitor; and
    a second plurality of capacitors coupled in parallel, the second plurality of capacitors coupled to the first capacitor.

4. The oscillator of claim 1, wherein:
  the trimmable capacitor is coupled to a first switch and a second switch;
  the first switch is coupled to ground; and
  the second switch is coupled to the trimmable current source.

5. The oscillator of claim 1, wherein the trimmable current source includes a trim control coupled to the first trimmable resistor and the second trimmable resistor.

6. The oscillator of claim 1, wherein the trimmable current source includes a trim system coupled to the bias circuit and the trim control.

7. The oscillator of claim 6, wherein the trim system includes a current measurement component.

8. An oscillator comprising:
  a trimmable capacitor;
  a trimmable current source coupled to the trimmable capacitor, wherein the trimmable current source includes:
    a first trimmable resistor and a second trimmable resistor, and wherein the first trimmable resistor and the second trimmable resistor each include: a fixed resistor; a plurality of resistors; and a plurality of switches, each of the plurality of switches is coupled to a respective one of the plurality of resistors; and
    a bias circuit coupled to a trim control, wherein the bias circuit includes a first portion current coupled to the first trimmable resistor and a second portion current coupled to the second trimmable resistor;
  a comparator coupled to the trimmable current source, the comparator including a comparator output and
  a data storage element coupled to the comparator output, the data storage element including one of a flip-flop and a latch, wherein the trimmable current source includes:
    a first amplifier coupled to a first transistor, the first transistor coupled to the second portion current and the second trimmable resistor;
    a second amplifier coupled to a second transistor, the second transistor coupled to the second trimmable resistor; and
    a third amplifier coupled to a third transistor, the third transistor coupled to the first portion current and the first trimmable resistor.

9. The oscillator of claim 8, wherein:
  the comparator includes a negative input; and
  the negative input is coupled to a voltage reference.

10. The oscillator of claim 8, wherein the trimmable capacitor includes:
  a first capacitor;
  a first plurality of capacitors coupled in parallel, the first plurality of capacitors coupled to the first capacitor; and
  a second plurality of capacitors coupled in parallel, the second plurality of capacitors coupled to the first capacitor.

11. The oscillator of claim 8, wherein:
  the trimmable capacitor is coupled to a first switch and a second switch;
  the first switch is coupled to ground; and
  the second switch is coupled to the trimmable current source.

12. The oscillator of claim 8, wherein the trimmable current source includes a trim system coupled to the bias circuit and the trim control.

13. The oscillator of claim 12, wherein the trim system includes a current measurement component.

14. An oscillator including a current source, the current source comprising:
a bias circuit including a first current;
a first trimmable resistor and a second trimmable resistor coupled to the bias circuit;
a trim system configured to measure the first current and determine an offset based on the first current; and
a trim control coupled to the trim system and the first trimmable resistor and the second trimmable resistor, the trim control configured to trim the first trimmable resistor based on the offset;
wherein the first trimmable resistor and the second trimmable resistor each include: a fixed resistor; a plurality of resistors; and a first plurality of switches, each of the first plurality of switches is coupled to a respective one of the plurality of resistors;
wherein the bias circuit is coupled to the trim control, further wherein the bias circuit includes the first current coupled to the first trimmable resistor and a second current coupled to the second trimmable resistor and wherein the bias circuit further includes: a plurality of transistors coupled in parallel and a second plurality of switches, and wherein each of the second plurality of switches is coupled to a respective drain of the plurality of transistors.

15. The oscillator of claim 14, wherein the first current is configured to be adjusted by setting the second plurality of switches to an open or a closed state in response to a code.

16. The oscillator of claim 14, wherein the second current is configured to be adjusted by setting the second plurality of switches to an open or a closed state in response to a code.

17. The oscillator of claim 14, further comprising:
a first amplifier coupled to a first transistor, the first transistor coupled to the second current and the second trimmable resistor;
a second amplifier coupled to a second transistor, the second transistor coupled to the second trimmable resistor; and
a third amplifier coupled to a third transistor, the third transistor coupled to the first current and the first trimmable resistor.

18. The oscillator of claim 14, wherein the trim system includes a current measurement component configured to measure the first current at a first test pin in response to the trim control closing a current mirror switch in the bias circuit.

* * * * *